United States Patent
Shu

(10) Patent No.: US 12,431,688 B1
(45) Date of Patent: Sep. 30, 2025

(54) DISTRIBUTED BRAGG REFLECTOR QUANTUM CASCADE LASERS

(71) Applicant: IRGLARE, LLC, Orlando, FL (US)

(72) Inventor: Hong Shu, Oveido, FL (US)

(73) Assignee: IRGLARE, LLC, Orlando, FL (US)

( * ) Notice: Subject to any disclaimer, the term of this patent is extended or adjusted under 35 U.S.C. 154(b) by 832 days.

(21) Appl. No.: 17/407,461

(22) Filed: Aug. 20, 2021

Related U.S. Application Data

(60) Provisional application No. 63/068,758, filed on Aug. 21, 2020.

(51) Int. Cl.

| | |
|---|---|
| H01S 5/34 | (2006.01) |
| H01S 5/10 | (2021.01) |
| H01S 5/12 | (2021.01) |
| H01S 5/125 | (2006.01) |
| H01S 5/22 | (2006.01) |

(52) U.S. Cl.
CPC ............ *H01S 5/125* (2013.01); *H01S 5/1028* (2013.01); *H01S 5/1221* (2013.01); *H01S 5/22* (2013.01); *H01S 5/3402* (2013.01)

(58) Field of Classification Search
CPC .............................. H01S 5/3401; H01S 5/3402
See application file for complete search history.

(56) References Cited

U.S. PATENT DOCUMENTS

| | | | | |
|---|---|---|---|---|
| 6,608,855 B1 * | 8/2003 | Hwang | ...................... | H01S 5/12 372/45.01 |
| 7,194,016 B2 * | 3/2007 | Bullington | ........... | G02B 6/4214 372/108 |
| 8,014,430 B2 | 9/2011 | Patel et al. | | |
| 8,068,524 B1 | 11/2011 | Patel et al. | | |
| 8,121,164 B1 | 2/2012 | Lyakh et al. | | |
| 9,077,153 B2 | 7/2015 | Maulini et al. | | |
| 9,608,408 B2 | 3/2017 | Yakh et al. | | |
| 10,020,635 B1 | 7/2018 | Lyakh | | |
| 10,177,535 B1 | 1/2019 | Lyakh | | |
| 10,230,210 B2 | 3/2019 | Patel et al. | | |
| 10,673,209 B2 | 6/2020 | Lyakh et al. | | |
| 10,811,847 B2 | 10/2020 | Lyakh et al. | | |
| 10,998,690 B2 | 5/2021 | Patel et al. | | |
| 11,791,609 B2 * | 10/2023 | Pan | ........................ | H01S 5/185 372/50.11 |
| 2009/0168820 A1 * | 7/2009 | Achtenhagen | .......... | H01S 5/024 372/34 |
| 2013/0010823 A1 | 1/2013 | Maulini et al. | | |

(Continued)

FOREIGN PATENT DOCUMENTS

JP          2014170825 A  *  9/2014  ............. B82Y 20/00

OTHER PUBLICATIONS

English Translation of Hashimoto (Year: 2014).*

(Continued)

*Primary Examiner* — Minsun O Harvey
*Assistant Examiner* — Stephen Sutton Kotter
(74) *Attorney, Agent, or Firm* — GrayRobinson, P.A.

(57) ABSTRACT

A QCL includes a gain region that generates radiation. An optical waveguide feeds the radiation back to the gain region. A first order and/or a second order Bragg reflector are formed in the optical waveguide. The first order Bragg reflector narrows a spectrum of the radiation. The second order Bragg reflector outcouples the radiation through a large facet.

27 Claims, 7 Drawing Sheets

(56) References Cited

U.S. PATENT DOCUMENTS

| | | | |
|---|---|---|---|
| 2017/0063044 A1* | 3/2017 | Dougakiuchi | H01S 5/1221 |
| 2018/0069374 A1* | 3/2018 | Kakuno | H01S 5/22 |
| 2018/0166860 A1* | 6/2018 | Hashimoto | H01S 5/164 |
| 2019/0334320 A1* | 10/2019 | Hashimoto | H01S 5/1057 |
| 2020/0395736 A1 | 12/2020 | Lyakh | |

OTHER PUBLICATIONS

Wilkens et al., "High-Efficiency Broad-Ridge Waveguide Lasers," in IEEE Photonics Technology Letters, vol. 30, No. 6, pp. 545-548, Mar. 15, 15, 2018, doi: 10.1109/LPT.2018.2801621. (Year: 2018).*

Feng Xie et al.; "High Power and High Temperature Continuous-Wave Operation of Distributed Bragg Reflector Quantum Cascade Lasers"; Applied Physics Letters; vol. 104; 071109; Jan. 2014.

Fuchs et al.; "Single Mode Quantum Cascade Lasers With Shallow-Etched Distributed Bragg Reflector"; OSA; vol. 20, No. 4; Optics Express; pp. 3890-3897; Feb. 13, 2012.

* cited by examiner

DISTRIBUTED BRAGG REFLECTOR QUANTUM CASCADE LASERS

CROSS-REFERENCE TO RELATED APPLICATION

This claims the benefit of priority to U.S. provisional Application No. 63/068,758, filed Aug. 21, 2020, which is incorporated by reference in its entirety.

STATEMENT OF FEDERALLY SPONSORED RESEARCH AND DEVELOPMENT

This invention was made with government support under STTR W911NF20P0007 awarded by the Army Research Office. The government has certain rights in the invention.

FIELD

This relates to the field of optics and, more particularly to quantum cascade lasers.

BACKGROUND

A quantum cascade laser ("QCL") is a semiconductor laser that uses intersubband radiative electron transitions between quantized energy levels to generate photons of radiation. QCLs have a gain region composed of multiple semiconductor layers with alternating band gap values grown by molecular beam epitaxy or metal organic chemical vapor deposition techniques. QCL offer high optical power, small size, and potentially low cost in the mid and long wave infrared spectrum.

BRIEF SUMMARY

This disclosure describes examples of QCLs that are capable of delivering high optical power in a relatively narrow and high-quality beam.

A first example of the device includes a quantum cascade laser (QCL) having a crystal growth direction. The QCL included a gain region that generates radiation. The gain region has a ridge width of at least 15 micrometers. An optical waveguide feeds the radiation back to the gain region. A first order Bragg reflector is formed in the optical waveguide and is coupled to the gain region in such a way that the first order Bragg reflector narrows the spectrum of the radiation. A facet at an end of the gain region emits the radiation from the QCL. This first example of the device may include one or more of the following features.

The first order Bragg reflector and facet may be spaced apart perpendicular to the crystal growth direction.

The facet may be on an edge of the QCL and the first order Bragg reflector and facet may be spaced apart perpendicular to the crystal growth direction in such a way that the first order Bragg reflector has a terminal end closest to the facet and the terminal end is displaced from the edge in a direction perpendicular to the crystal growth direction.

The first order Bragg reflector may have a resonance wavelength that is detuned from a peak gain wavelength of the QCL to reduce mode self-focusing.

The gain region may have a thickness in the growth direction of not more than 1 μm.

The first order Bragg reflector may be on an cladding layerof the optical waveguide.

The gain region may have a plurality of stages composed of alternating quantum wells and quantum barriers where the stages are separated by one or more semiconductor spacers.

A second example of the device includes a QCL having a crystal growth direction. The QCL includes a gain region that generates radiation. An optical waveguide feeds the radiation back to the gain region. The first order Bragg reflector is formed in the optical waveguide and is coupled to the gain region in such a way that the first order Bragg reflector narrows the spectrum of the radiation. A facet at an end of the gain region emits the radiation from the QCL non-parallel to the crystal growth direction. The first order Bragg reflector and facet are spaced apart perpendicular to the crystal growth direction. This second example of the device may include one or more of the following features.

The facet may be on an edge of the QCL and the first order Bragg reflector and facet may be spaced apart perpendicular to the crystal growth direction in such a way that the first order Bragg reflector has a terminal end closest to the facet and the terminal end is displaced from the edge in a direction perpendicular to the crystal growth direction.

The gain region may have a ridge width of at least 15 micrometers.

The gain region may have a thickness in the growth direction of not more than 1 m.

The first order Bragg reflector may have a resonance wavelength and the resonance wavelength may be detuned from a peak gain wavelength of the QCL to reduce mode self-focusing.

The first order Bragg reflector may be on a cladding layer of the optical waveguide.

The gain region may have a plurality of stages composed of alternating quantum wells and quantum barriers and at least some of the stages are separated by one or more semiconductor spacers including InP.

A third example of the device includes a QCL having a crystal growth direction. The QCL includes a gain region that generates radiation. An optical waveguide feeds the radiation back to the gain region. A first order Bragg reflector is formed in the optical waveguide and is coupled to the gain region in such a way that the first order Bragg reflector narrows the spectrum of the radiation. The first order Bragg reflector has a resonance wavelength, the resonance wavelength is detuned from a peak gain wavelength of the QCL to reduce mode self-focusing. A facet emits the radiation from the QCL. This third example of the device may include one or more of the following features.

The gain region may have a ridge width of at least 15 micrometers.

The gain region may have a thickness in the growth direction of not more than 1 m.

The first order Bragg reflector and facet may be spaced apart perpendicular to the crystal growth direction.

The facet may be on an edge of the QCL and the first order Bragg reflector and facet may be spaced apart perpendicular to the crystal growth direction in such a way that the first order Bragg reflector has a terminal end closest to the facet and the terminal end is displaced from the edge in a direction perpendicular to the crystal growth direction.

The first order Bragg reflector is on a cladding layer of the optical waveguide.

The gain region may have a plurality of stages composed of alternating quantum wells and quantum barriers and at least some of the stages are separated by one or more semiconductor spacers including InP.

A fourth example of the device includes a QCL having a crystal growth direction. The QCL includes a gain region that generates radiation. An optical waveguide feeds the radiation back to the gain region. A first order Bragg reflector is formed in the optical waveguide and is coupled to the gain region in such a way that the first order Bragg reflector narrows the spectrum of the radiation. A second order Bragg reflector is formed in the optical waveguide. A facet emits the radiation from the QCL along the crystal growth direction. This fourth example of the device may include one or more of the following features.

The gain region may have a ridge width of at least 15 micrometers.

The gain region may have a thickness in the growth direction of not more than 1 µm.

The first order Bragg reflector may have a resonance wavelength that is detuned from the peak gain wavelength of the QCL to reduce mode self-focusing.

The first order Bragg reflector and second order Bragg reflector may have different resonance wavelengths.

The first order Bragg reflector may have a grating with peaks and valleys spaced apart by a first period and the second order Bragg reflector may have a grating with peaks and valleys spaced apart by a second period. The second period may be different enough from twice the first period to cause the facet to emit the radiation at an angle that is not parallel to the crystal growth direction. The first order Bragg reflector and second order Bragg reflector may be on a cladding layer of the optical waveguide.

The gain region may have a plurality of stages composed of alternating quantum wells and quantum barriers and at least some of the stages are separated by one or more semiconductor spacers including InP.

A fifth example of the device includes a QCL having a crystal growth direction. The QCL includes a gain region that generates radiation. An optical waveguide feeds the radiation back to the gain region. The gain region and optical waveguide form a resonator. A Bragg reflector is formed in the optical waveguide and is coupled to the gain region. A facet that emits the radiation from the QCL. The QCL has a predominant optical mode, the predominant optical mode being a fundamental optical mode. This fifth example of the device may include one or more of the following features.

The Bragg reflector may be a first order Bragg reflector formed in the optical waveguide and coupled to the gain region in such a way that the first order Bragg reflector narrows a spectrum of the radiation.

The Bragg reflector may be a second order Bragg reflector formed in the optical waveguide.

The gain region may have a ridge width of at least 15 micrometers.

The gain region may have a thickness in the growth direction of not more than 1 µm.

The fundamental optical mode may be $TM_{00}$.

The gain region may have a plurality of stages composed of alternating quantum wells and quantum barriers and at least some of the stages are separated by one or more semiconductor spacers including InP.

DETAILED DESCRIPTION OF EXAMPLE EMBODIMENTS

This disclosure describes example aspects and embodiments, but not all possible aspects embodiments of the QCL systems and devices. Where a particular feature is disclosed in the context of a particular aspect or embodiment, that feature can also be used, to the extent possible, in combination with and/or in the context of other aspects and embodiments. The QCL systems and devices may be embodied in many different forms and should not be construed as limited to only the embodiments described here.

Figure 1:
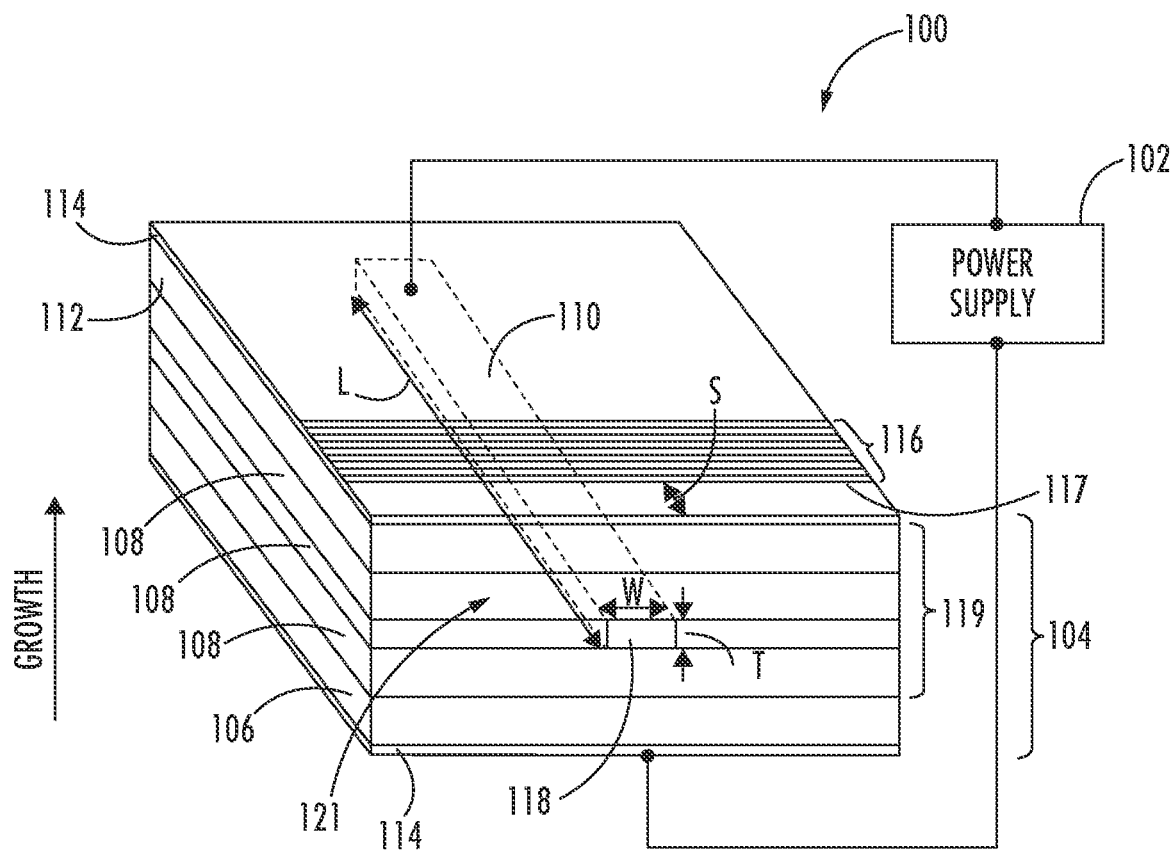
FIG. 1 is a perspective view of a diagram of a first example of a QCL system with a first example of a QCL device.

Referring to FIG. 1 a first example of the QCL system 100 includes a power supply 102 and a QCL device 104. The power supply 102 provides electric power to operate the QCL device 104. The QCL device 104 includes a substrate 106, cladding layers 108, a gain region 110, an ohmic contact region 112, electrical contacts 114, a first order Bragg reflector 116, and a facet 118.

The power supply 102 may be a conventional QCL power supply. Typically the power supply 102 can operate at currents up to 20 A and voltages up to 25 V. Although the power supplied to the QCL device 104 is design and wavelength dependent, it is typical to supply 2 A and 15 V to a QCL device 104. The QCL device 104 may operate in either pulse or continuous wave mode. Pulse widths of the QCL device 104 may be <1 ns.

The substrate 106 is made from one or more semiconducting materials. Examples of semiconducting materials suitable for the substrate 106 include, but are not limited to, InP, GaAs, and InAs.

The cladding layers 108 are made from one or more semiconducting materials. Examples of semiconducting materials for the cladding layers 108 include, but are not limited to InP, InGaAs, and the like.

Together, the gain region 110 and cladding layers 108 cooperate to form an optical waveguide 119 that feeds radiation generated by the gain region 110 back to the gain region 110.

The ohmic contact region 112 provides ohmic electrical contact between the electrical contact 114 it is touching and the upper cladding layer 108. The ohmic contact region 112 may also cooperate with the cladding layers 108 and gain region 110 to form part of the optical waveguide 119. In some cases, the ohmic contact region 112 may be another cladding layer 108. The ohmic contact region 112 is made from one or more doped semiconducting materials. Examples of semiconducting materials for the ohmic contact region 112 include, but are not limited to highly-doped InGaAs, InP, and the like.

The electrical contacts 114 are made of one or more conducting materials, such as metals or the like, that allow the QCL device 104 to receive electrical power from the power supply 102.

The facet 118 is the portion of QCL device 104 that outputs the radiation. The QCL device 104 in FIG. 1 is an edge emitting QCL because the facet is positioned on the edge of the QCL device 104 formed along the growth direction. The facet 118 in the QCL device of FIG. 1 emits radiation non-parallel, often substantially perpendicular, to the growth direction.

Figure 2:
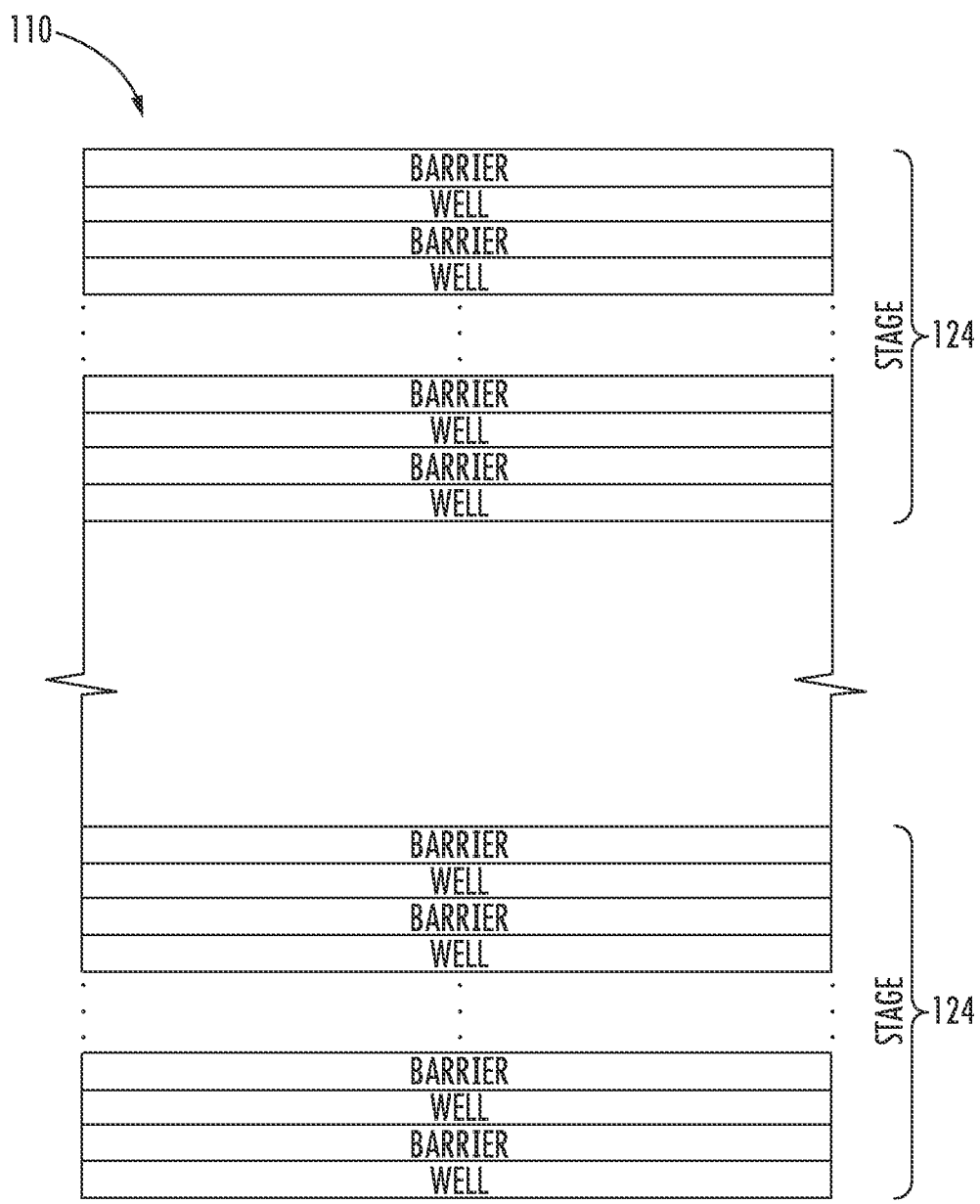
FIG. 2 is a sectional view of an example of a gain region of the QCL device.

Referring also to FIG. 2, the gain region 110 includes a plurality of stages 124 composed of optically interacting quantum wells 120 and quantum barriers 122. When a voltage is applied across the gain region 110, the stages 124 generate photons of radiation due to carrier excitation and relaxation between subbands. The number of stages 124 and thickness of stages in the crystal growth direction can vary depending on the desired properties of the QCL device 104. The gain region 110 is grown in the growth direction shown in FIG. 3 using a semiconductor growth technique such as molecular beam epitaxy ("MBE") and metal organic chemical vapor deposition ("MOCVD") and the like.

The quantum well portions may be made of one or more semiconducting materials. Examples of semiconducting materials suitable for the quantum wells include, but are not limited to, InGaAs, GaAs, InAs, and the like.

The quantum barrier portions may be made of one or more semiconducting materials. Examples of semiconducting materials suitable for the quantum barriers include, but are not limited to, AlInAs, AlAsSb, and AlSb.

The dimensions of the gain region 110 can vary depending on the desired performance of the QCL device 104. The conventional gain region 100 has a width W of about 10 μm, a thickness T in the growth direction of about 2 μm and a length of about 1-10 mm. Such a gain region 110 typically has 30-50 stages in which each stage has a thickness of approximately 45 nm. A gain region 110 with these conventional dimensions will function properly with the QCL device 104.

In certain examples of the QCL device 104, the dimensions of the gain region 110 have what is called a "broad area configuration." In such examples, the thickness T in the growth direction is not more than 1 μm, the width W is at least 15 nm, and the length L is 1-10 mm. Using the broad area configuration for the gain region 110 may allow the QCL device to generate more radiation power than the standard configuration. The gain region 110 in the broad area configuration may have 10-20 stages 124.

Figure 3:
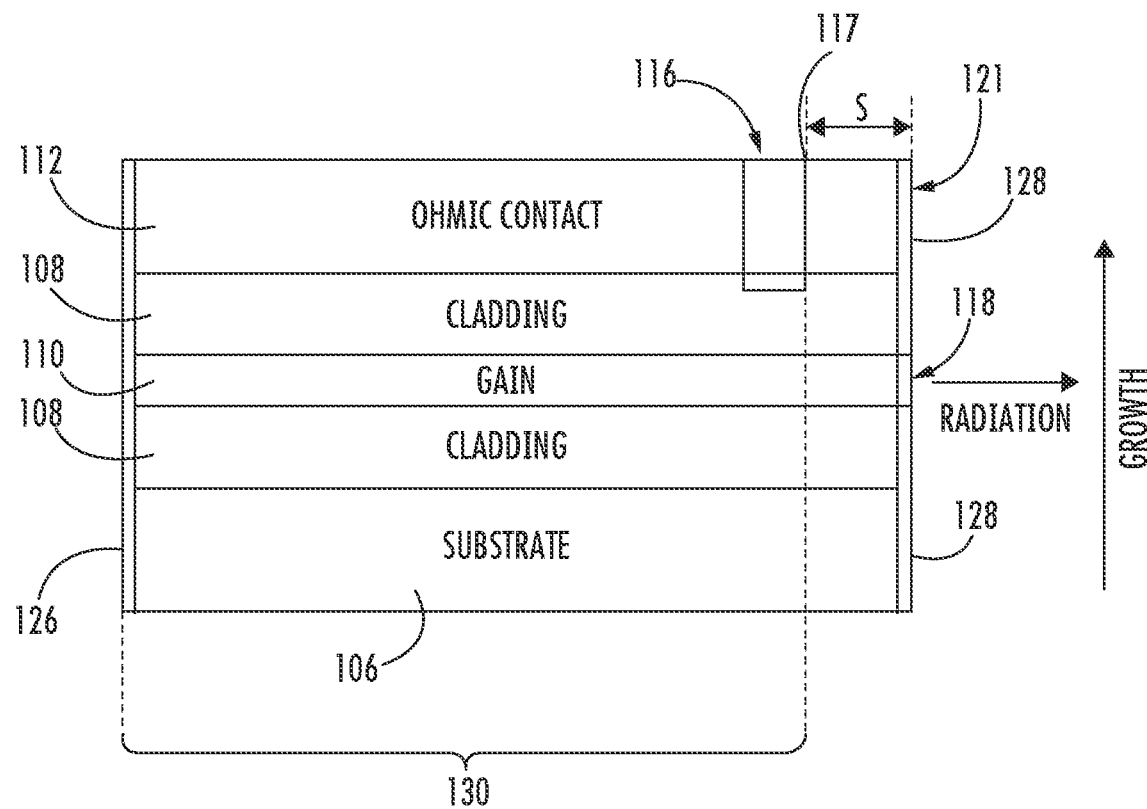
FIG. 3 is a side sectional view of the first example of the QCL device.
Figure 4:
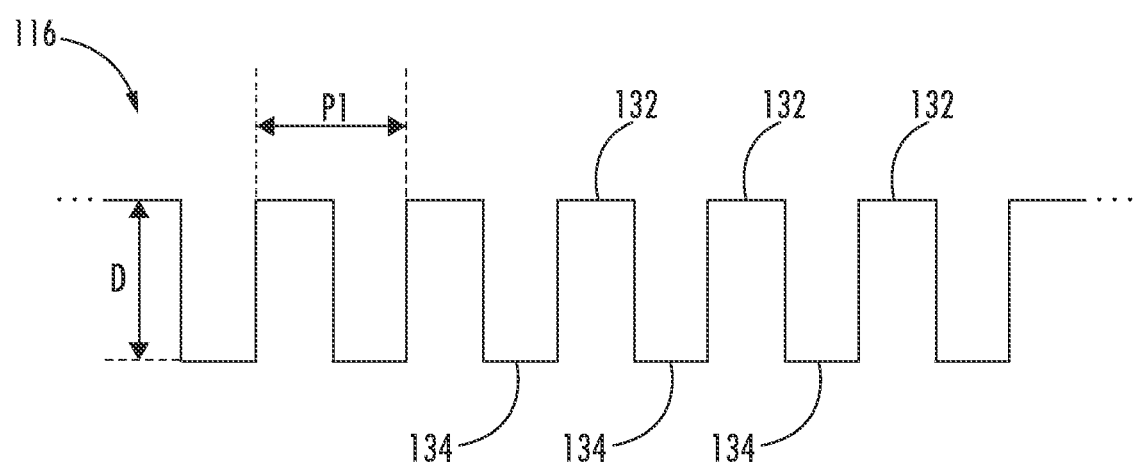
FIG. 4 is a zoom view of an example of a first order Bragg reflector.

Referring to FIGS. 3 and 4, the first order Bragg reflector 116 is formed on the optical waveguide 119 and is optically coupled to the gain region 110 in such a way that it narrows the wavelength spectrum of the radiation the gain region 110 generates. This feature provides for improved wavelength selectability compared to conventional Fabry-Perot QCLs.

The first order Bragg reflector 116 includes a periodic grating of peaks 132 and valleys 134 separated in distance by a period P1 and having a depth D. The grating causes the guided radiation mode to experience weak reflections as it propagates through the optical waveguide 119, which provides wavelength selective feedback. The depth D and the waveguide structure determine how well coupled the first order Bragg reflector 116 is to the optical waveguide 119 and can vary depending on the desired properties from approximately 100 nm to 3 μm for most structures.

Constructive interference for the reflected radiation waves narrows the radiation spectrum to a wavelength approximately equal to the Bragg reflector's resonance wavelength ("Bragg wavelength") $\lambda_B = 2n_{eff}\Lambda/N$ where $n_{eff}$ is the average refractive index along the laser resonator 130, $\Lambda$ is the grating period, and N is the grating order. Thus, the period $\Lambda$, or P1 in FIG. 4 can be varied in different QCL devices to obtain a narrow wavelength beam centered at a desired wavelength.

A QCL with a $1^{st}$ order Bragg reflector spanning the entire laser cavity is called a distributed feedback QCL or a DFB QCL. One problem with conventional DFB QCLs is that the grating interacts with the guided mode over entire device length, which may cause high optical losses, reducing laser power and efficiency.

To overcome this problem, it may be advantageous to form by etching or the like the grating only into a small section of the waveguide, leaving the rest of the waveguide unperturbed by the grating. This is a distributed Bragg reflector (DBR) configuration.

It is also advantageous to use the gain region 110 having the broad area configuration described above. Such a QCL device 104 may emit radiation with a large power. Also, because the gain region 110 with the broad area configuration has a weak waveguide, meaning the guided mode is large along the growth direction, the guided mode overlaps with distant cladding layers 108. As a consequence, it is possible to place a shallow grating $1^{st}$ order Bragg reflector formed on top of the ohmic contact region 112 and upper cladding layers 108 to simplify wafer processing and reduce production costs.

Another problem with conventional DFB and DBR QCLS is that the grating contacts the edge of the QCL. The edge of the QCL is the side of the QCL that includes the facet for an edge emitting QCL. The edge, therefore, extends parallel to the growth direction. Unfortunately, the area of the QCL immediately adjacent the edge facet is the hottest portion of the QCL. This heating can have an undesired effect on the radiation reflected by the grating, which may reduce the effectiveness of the grating.

Referring back to the QCL device 104 in FIGS. 1-4, to reduce this effect, the first order Bragg reflector 116 and facet 118 are spaced apart by a distance S perpendicular to the growth direction in such a way that a terminal end 117 of the first order Bragg reflector 116 that is closest to the facet 118 is displaced from the edge 121 in a direction perpendicular to the crystal growth direction. The distance S may be selected based on the distance needed to reduce heating near the facet 118, which may depend on how the particular QCL device 104 is constructed. An example of a distance S includes, but is not limited to, hundreds of μm.

Figure 5:
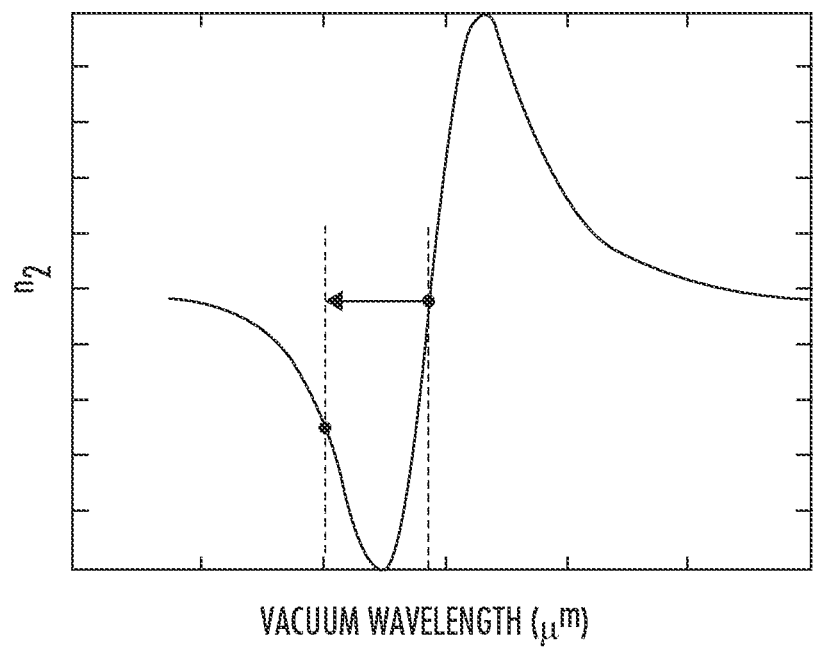
FIG. 5 is a graph of the non-linear refractive index $n_2$ vs. wavelength for an example of the gain region.

In some examples of the QCL device 104, it may be advantageous to select a period P1 that provides the first order Bragg reflector 116 with a Bragg wavelength where the gain region 110 has a non-zero nonlinear refractive index $n_2$. Referring to FIG. 5, the $n_2$ of an example gain region 110 is shown as a function of wavelength. In this example $n_2=0$ at a wavelength of about 7.9 μm. When the Bragg wavelength corresponds to a wavelength where $n_2<0$, this makes the optical waveguide 119 weaker, which favors a broad fundamental spatial mode.

For example, at point A on the graph $n_2=-2$ at 7.5 μm. If the period P1 is selected so that the Bragg wavelength is 7.5 μm, the $1^{st}$ order Bragg reflector will narrow the radiation spectrum around a center of 7.5 μm and the fundamental spatial mode will become more favorable. Also, the peak intensity of the guided mode will reduce, which will improve laser reliability at high power.

Figure 6:
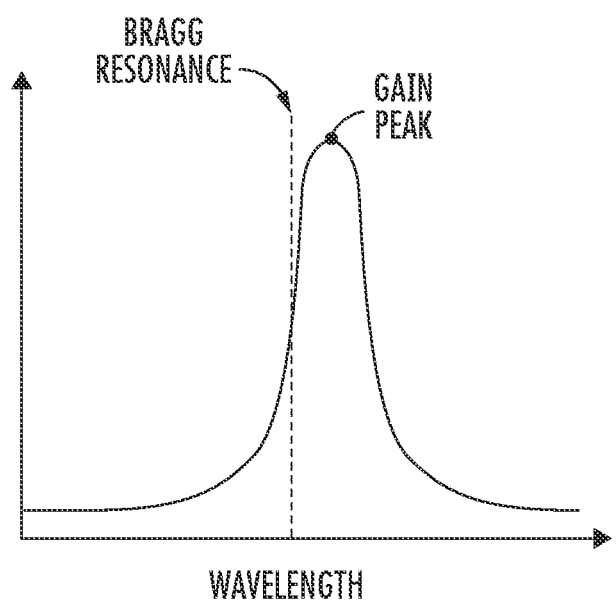
FIG. 6 is a graph of gain as a function of wavelength.

As illustrated in FIG. 6, the resonance wavelength of the first order Bragg reflector 116 is detuned from the peak gain wavelength of the QCL to reduce mode self-focusing. By being "detuned" the resonance wavelength does not coincide with the maximum in the gain spectrum.

One problem with high-power edge emitting QCLs is that the facet 118 on the edge 121 is so small it has a limited amount of radiation that can pass through it before it overheats and fails. A second example of a QCL system 200 with a second example of a QCL device 202 will now be described by referring to FIGS. 7-9. This second example solves the aforementioned problem.

To avoid being redundant, the same reference numerals are used to refer to features that QCL device 202 has in common with QCL device 104. QCL device 202 is different than QCL device 104 because QCL device 202 also includes a second order Bragg reflector 204 on the ohmic contact region 112 and upper cladding layers adjacent the first order Bragg reflector 116. The second order Bragg reflector 204 is operable to reflect the radiation through the QCL device 202 in the growth direction so that the radiation is emitted substantially parallel to the growth direction. The advantage of this construction is that the facet 118 can be made extremely large since a portion of the substrate 106 serves as the facet 118. The facet 118 in this example may be 2 mm by 10-20 µm for example, which is about 1000 times larger than a conventional facet of an edge emitting QCL.

Figure 8:
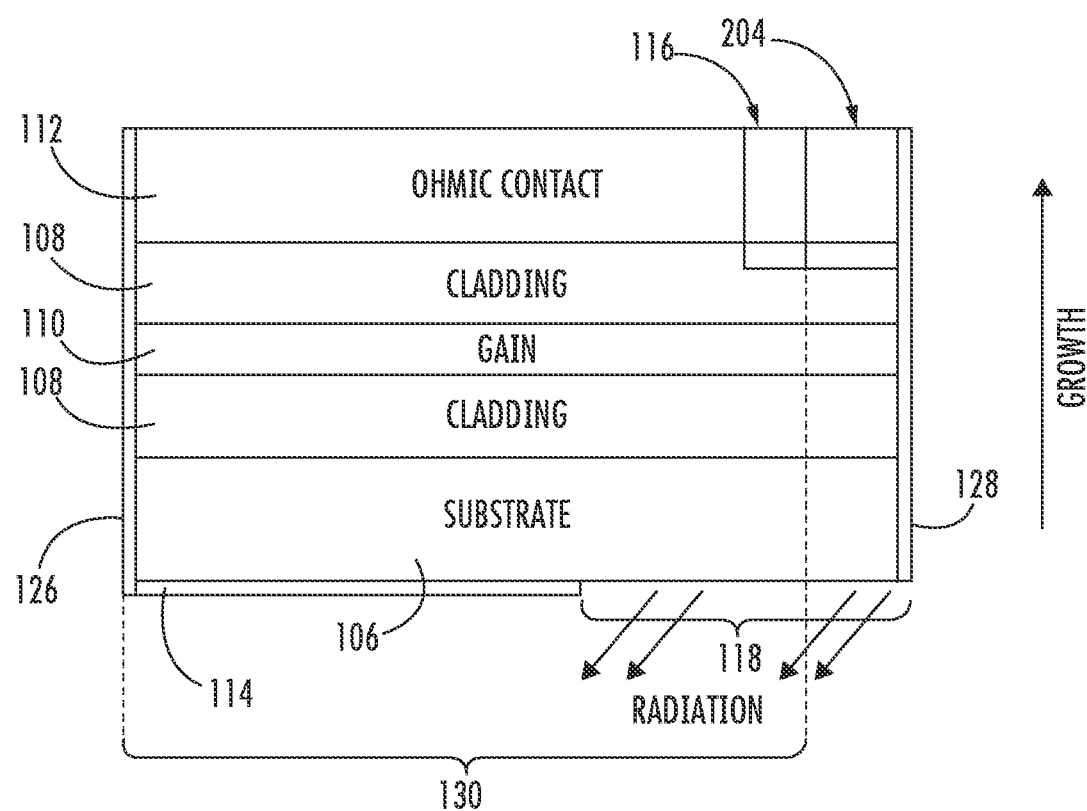
FIG. 8 is a side sectional view of the second example of the QCL device.

As shown in FIG. 8, compared to QCL device 104, a portion of the electrical contact 114 at the bottom is removed to permit the substrate 106 to serve as the facet 118 and emit the radiation.

Figure 7:
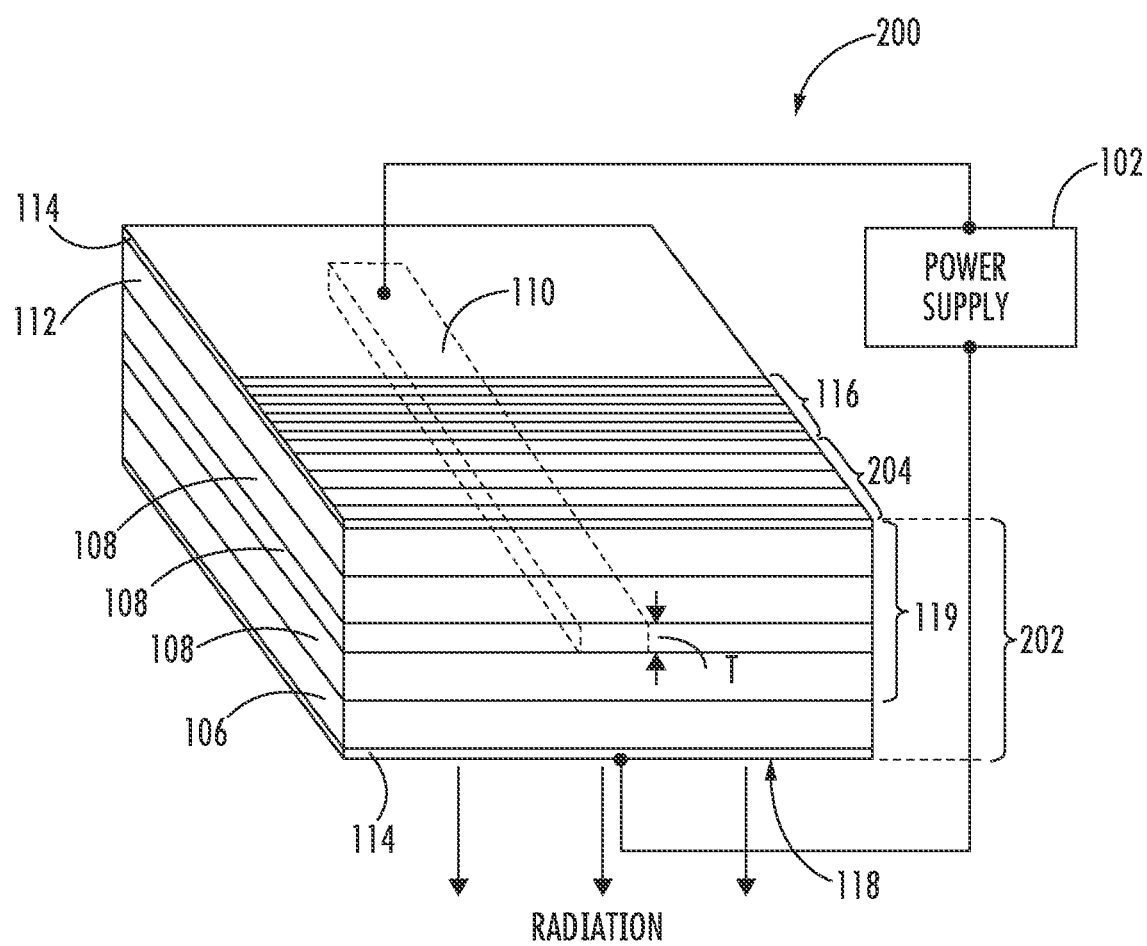
FIG. 7 is a perspective view of a diagram of a second example of a QCL system with a second example of a QCL device.

The relative positions of the first order Bragg reflector 116 and second order Bragg reflector 204 in FIGS. 7 and 8 are not required. In other examples these features may be spaced apart or positioned differently than shown.

Figure 9:
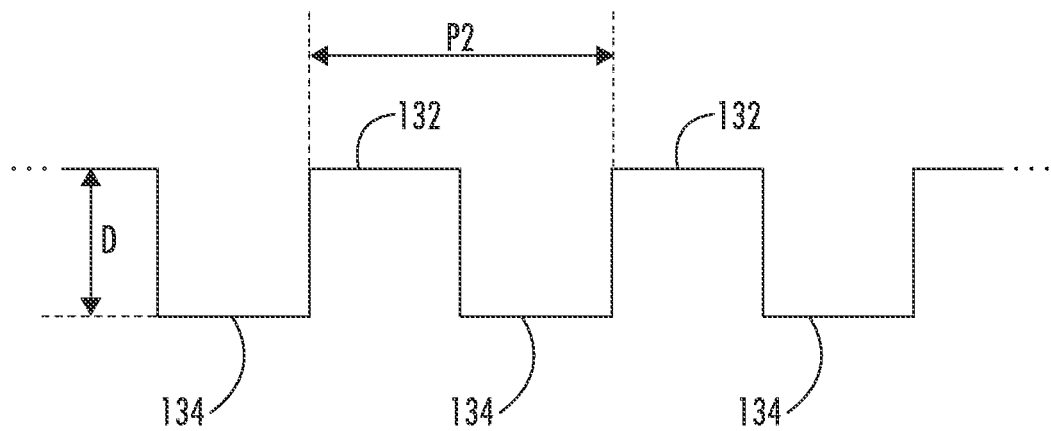
FIG. 9 is a zoom view of an example of a second order Bragg reflector.

Referring to FIG. 9, the second order Bragg reflector 204 has a depth D and period P2 defined by the peaks 132 and valleys 134. In some cases, period P2 may be selected to be twice the period P1 of the first order Bragg reflector 116. In other cases, the second order Bragg reflector 204 may cause optical feedback that can be reduced by selecting a period P2 for the second order Bragg reflector 204 that gives the second order Bragg reflector 204 a Bragg wavelength different from the Bragg wavelength of the first order Bragg reflector 116. This may be the case, for example, when P2 is not substantially equal to 2*P1. In general, the second period P2 is different enough from 2*P1 to cause the facet 118 to emit the radiation at an angle that is not parallel to the crystal growth direction as illustrated in FIG. 7. The detuning of the Bragg reflectors 102, 204 allows for their independent optimization, if necessary.

When the gain region 110 is pumped to transparency (i.e. when population inversion $\Delta N=0$, then $n_2=0$ and the nonlinear index change $n_2 I=0$. In a region that is pumped just to transparency, the temperature is low and more uniform, meaning thermally induced non-uniformity in the refractive index is suppressed. Accordingly, it can be advantageous to pump the first order Bragg reflector 116 and second order Bragg reflector 204 to transparency to suppress thermal lensing and to avoid self-focusing.

The gain region 110 of the QCL device 202 may have the standard configuration or the broad area configuration described above.

Either of the QCL devices 104,202 can be combined with a gain region 110 design that has a low mode overlap factor $\Gamma$ with the gain region. By having a low $\Gamma$, the devices will favor the fundamental mode of operation even when the broad area configuration of the gain region 110 is used. This may permit construction of broad area ridge waveguides rather than buried heterostructure DBR QCLs, offering high power, high efficiency, and high beam quality at relatively low cost.

The low $\Gamma$ may be achieved by either reducing the number of stages 124 to 30 or less using the broad area configuration gain region. But the disadvantage of using fewer stages is that a single electron will emit fewer photons, making it difficult to scale up the power.

Figure 10:
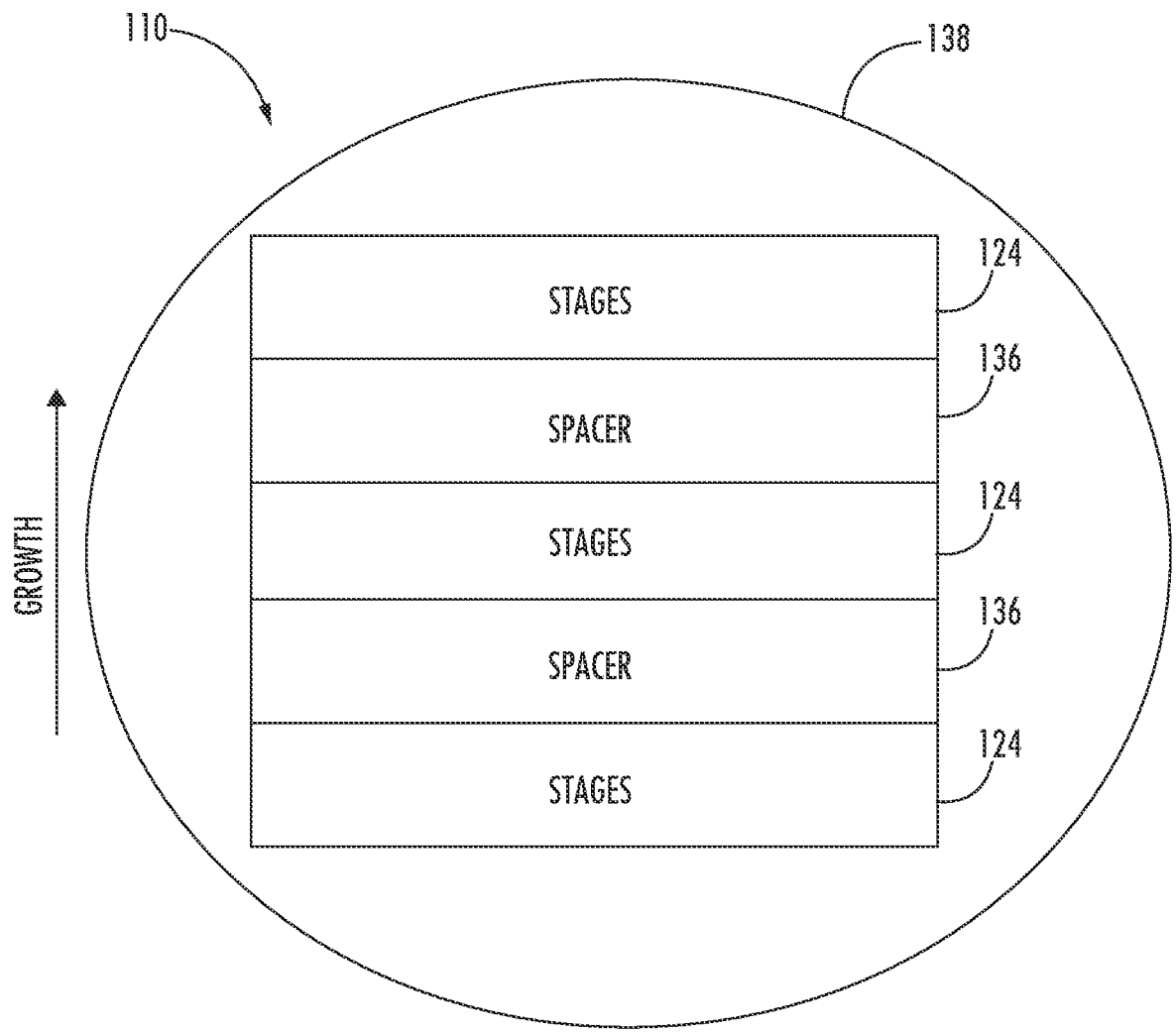
FIG. 10 is a diagram of a gain region including spacers.

Low thermal resistance and high beam quality with a larger number of stages 124 may be achieved by inserting semiconductor spacers between certain stages 124 in the gain region 110. Referring to FIG. 10, an example of a gain region 110 with low $\Gamma$ includes a series of stacks of stages 124 separated by spacers 136. The stacks of stages 124 may have more than twenty individual stages 124.

The spacers 136 include semiconductor material with high thermal conductivity to help reduce thermal resistance, especially perpendicular to the growth direction. The spacers 136 may be made of a one or more semiconducting materials including, but not limited to InP, InGaAs, and the like. The spacers 136 may have a thickness in the growth direction of 0.1 to 3 µm, for example.

The optical mode 138 has a large overlap with the spacers 136, which reduces the mode's 138 overlap with the stages 124. This construction makes a gain region 110 having the conventional, standard number of stages 124 compatible with a broad-area configuration QCL with a high beam quality.

In some examples of the QCL devices 104, 202, the optical mode and gain region have a mode overlap factor ($\Gamma$) that favors the fundamental optical mode of the resonator 130. Such a configuration may also be used with a QCL device similar to QCL device 202 without the first order Bragg reflector 116, using the broad area configuration for the gain region 110, and/or using an active region with the spacers 136 in FIG. 10.

The mode with the highest ratio of $\Gamma$ to net losses ($\alpha_{tot}$) will dominate. The ratio ($\Gamma/\alpha_{tot}$) can be taken as a figure of merit (FOM). The QCL device 104, 202 configuration may be optimized for the $TM_{00}$ mode to have the highest FOM. Waveguides with a thin standard configuration gain region 110 and/or waveguides including spacers 136 reduce the FOM for higher order modes. Therefore, such devices can operate on the fundamental mode even in the case of wide gain regions with the broad area configuration. It is advantageous to adjust the number of stages 124, stage thickness, number of spacers 136, spacer thicknesses, and gain region 110 ridge width W in the design of QCL devices 104 and 202 to ensure that $TM_{00}$ mode has the highest FOM. These adjustments can be simulated using optics simulation software prior to fabricating the devices.

This document refers to particular features of the devices. Although certain features may be described in combination with a particular example embodiment, it is to be understood that a feature described with respect to one example embodiment may be used in any of the other example embodiments to the extent possible.

The skilled person will understand that the devices and their features may be modified in many different ways without departing from the scope of what is claimed. The scope of the claims is not limited to only the particular features and examples described above.

That which is claimed is:

1. A device comprising a quantum cascade laser (QCL) having a crystal growth direction, the QCL comprising:

a gain region that generates radiation, the gain region having a ridge width of at least 15 micrometers, the gain region having a thickness in the growth direction of not more than 1 µm;

an optical waveguide that feeds the radiation back to the gain region;

a first order Bragg reflector formed in the optical waveguide and coupled to the gain region in such a way that the first order Bragg reflector narrows a spectrum of the radiation; and a facet at an end of the gain region that emits the radiation from the QCL.

2. The device of claim 1, wherein the first order Bragg reflector and facet are spaced apart perpendicular to the crystal growth direction.

3. The device of claim 1, wherein:
the facet is on an edge of the QCL; and
the first order Bragg reflector and facet are spaced apart perpendicular to the crystal growth direction in such a way that the first order Bragg reflector has a terminal end adjacent to the facet and the terminal end is displaced from the edge in a direction perpendicular to the crystal growth direction.

4. The device of claim 1, wherein the first order Bragg reflector has a resonance wavelength, the resonance wavelength being detuned from a peak gain wavelength of the QCL to reduce mode self-focusing.

5. The device of claim 1, wherein the first order Bragg reflector is on a cladding layer of the optical waveguide.

6. The device of claim 1, wherein the gain region has a plurality of stages composed of alternating quantum wells and quantum barriers and the stages are separated by one or more semiconductor spacers.

7. A device comprising a quantum cascade laser (QCL) having a crystal growth direction, the QCL comprising:
a gain region that generates radiation, the gain region terminating at a facet that emits the radiation from the gain region;
an optical waveguide that feeds the radiation back to the gain region; and
a first order Bragg reflector formed in the optical waveguide and coupled to the gain region in such a way that the first order Bragg reflector narrows a spectrum of the radiation;
the first order Bragg reflector and facet being spaced apart perpendicular to the crystal growth direction.

8. The device of claim 7, wherein:
the facet is on an edge of the QCL; and
the first order Bragg reflector and facet are spaced apart perpendicular to the crystal growth direction in such a way that the first order Bragg reflector has a terminal end adjacent to the facet and the terminal end is displaced from the edge in a direction perpendicular to the crystal growth direction.

9. The device of claim 7, wherein the gain region has a ridge width of at least 15 micrometers.

10. The device of claim 7, wherein the gain region has thickness in the growth direction of not more than 1 µm.

11. The device of claim 7, wherein the first order Bragg reflector has a resonance wavelength, the resonance wavelength being detuned from a peak gain wavelength of the QCL to reduce mode self-focusing.

12. The device of claim 7, wherein the first order Bragg reflector is on a cladding layer of the optical waveguide.

13. The device of claim 7, wherein the gain region has a plurality of stages composed of alternating quantum wells and quantum barriers and at least some of the stages are separated by a semiconductor spacer including InP.

14. A device comprising a quantum cascade laser (QCL) having a crystal growth direction, the QCL comprising:
a gain region that generates radiation, the gain region terminating at a facet that emits the radiation from the gain region;
an optical waveguide that feeds the radiation back to the gain region; and
a first order Bragg reflector formed in the optical waveguide and coupled to the gain region in such a way that the first order Bragg reflector narrows a spectrum of the radiation, the first order Bragg reflector having a resonance wavelength, the resonance wavelength being detuned from a peak gain wavelength of the QCL to reduce mode self-focusing, the first order Bragg reflector and facet being spaced apart perpendicular to the crystal growth direction.

15. The device of claim 14, wherein the gain region has a ridge width of at least 15 micrometers.

16. The device of claim 14, wherein the gain region has a thickness in the growth direction of not more than 1 µm.

17. The device of claim 14, wherein:
the facet is on an edge of the QCL; and
the first order Bragg reflector and facet are spaced apart perpendicular to the crystal growth direction in such a way that the first order Bragg reflector has a terminal end adjacent to the facet and the terminal end is displaced from the edge in a direction perpendicular to the crystal growth direction.

18. The device of claim 14, wherein the first order Bragg reflector is on a cladding layer of the optical waveguide.

19. The device of claim 14, wherein the gain region has a plurality of stages composed of alternating quantum wells and quantum barriers and at least some of the stages are separated by one or more semiconductor spacers including InP.

20. A device comprising a quantum cascade laser (QCL) having a crystal growth direction, the QCL comprising:
a gain region that generates radiation;
an optical waveguide that feeds the radiation back to the gain region;
a first order Bragg reflector formed in the optical waveguide and coupled to the gain region in such a way that the first order Bragg reflector narrows a spectrum of the radiation;
a second order Bragg reflector formed in the optical waveguide, the first order Bragg reflector and second order Bragg reflector being formed on only a portion of the optical waveguide, thereby having a distributed Bragg reflector configuration; and
a facet that emits the radiation from the QCL along the crystal growth direction.

21. The device of claim 20, wherein the gain region has a ridge width of at least 15 micrometers.

22. The device of claim 20, wherein the gain region has a thickness in the growth direction of not more than 1 µm.

23. The device of claim 20, wherein the first order Bragg reflector has a resonance wavelength, the resonance wavelength being detuned from a peak gain wavelength of the QCL to reduce mode self-focusing.

24. The device of claim 20, wherein the first order Bragg reflector and second order Bragg reflector have different resonance wavelengths.

25. The device of claim 20, wherein:
the first order Bragg reflector has a grating with peaks and valleys spaced apart by a first period;

the second order Bragg reflector has a grating with peaks and valleys spaced apart by a second period; and the second period is different enough from twice the first period to cause the facet to emit the radiation at an angle that is not parallel to the crystal growth direction.

26. The device of claim 20, wherein the first order Bragg reflector and second order Bragg reflector are on a cladding layer of the optical waveguide.

27. The device of claim 20, wherein the gain region has a plurality of stages composed of alternating quantum wells and quantum barriers and at least some of the stages are separated by one or more semiconductor spacers including InP.

* * * * *